(12) United States Patent
Cho et al.

(10) Patent No.: US 10,528,171 B2
(45) Date of Patent: Jan. 7, 2020

(54) DISPLAY PANEL AND DISPLAY DEVICE INCLUDING THE SAME

(71) Applicant: Samsung Display Co., Ltd., Yongin-si (KR)

(72) Inventors: Daeyoun Cho, Yongin-si (KR); Cheolkyu Kim, Seoul (KR); Hyojung Kim, Suwon-si (KR); Jongwoo Park, Seongnam-si (KR); Youngsun Hwang, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/445,681

(22) Filed: Jun. 19, 2019

(65) Prior Publication Data

US 2019/0302946 A1    Oct. 3, 2019

Related U.S. Application Data

(63) Continuation of application No. 15/843,775, filed on Dec. 15, 2017, now Pat. No. 10,345,942.

(30) Foreign Application Priority Data

Dec. 16, 2016  (KR) ........................ 10-2016-0172918

(51) Int. Cl.
*G06F 3/041*  (2006.01)
*G06K 9/00*  (2006.01)
(Continued)

(52) U.S. Cl.
CPC ............ *G06F 3/0412* (2013.01); *G06F 3/042* (2013.01); *G06K 9/0004* (2013.01);
(Continued)

(58) Field of Classification Search
CPC . G06F 2203/04102; G06F 2203/04106; G06F 3/0412; G06F 3/042; G06F 3/044;
(Continued)

(56) References Cited

U.S. PATENT DOCUMENTS 8,081,147 B2   12/2011   Lee et al.
8,193,017 B2   6/2012    Kim et al.
(Continued)

FOREIGN PATENT DOCUMENTS

| KR | 10-2003-0058719 | 7/2003 |
|----|-----------------|--------|
| KR | 10-1243822      | 3/2013 |
| KR | 10-1264728      | 5/2013 |

OTHER PUBLICATIONS

Notice of Allowance dated Feb. 28, 2019, in U.S. Appl. No. 15/843,775.

(Continued)

*Primary Examiner* — Michael J Jansen, II
(74) *Attorney, Agent, or Firm* — H.C. Park & Associates, PLC

(57) ABSTRACT

A display panel includes a base layer, a circuit layer, and a pixel layer. The base layer includes a plurality of light emitting areas, and a plurality of transmitting areas to transmit light incident thereto. The circuit layer includes a plurality of switching devices disposed on the light emitting areas, and a plurality of photosensors disposed on the transmitting areas. The pixel layer includes a light emitting element to emit light based on reception of a current from at least one of the plurality of switching devices. The light emitting element overlaps with one of the plurality of light emitting areas. At least one of the plurality of photosensors is configured to receive a portion of external light reflected (Continued)

from an external object after transmission of the external light through at least one of the plurality of transmitting areas.

20 Claims, 19 Drawing Sheets

(51) Int. Cl.
    *G06F 3/042*     (2006.01)
    *H01L 27/32*     (2006.01)
    *H01L 51/00*     (2006.01)
    *H01L 27/146*     (2006.01)

(52) U.S. Cl.
    CPC ........ *H01L 27/323* (2013.01); *H01L 27/3269* (2013.01); *H01L 51/0097* (2013.01); *G02F 2203/01* (2013.01); *G02F 2203/09* (2013.01); *G06F 2203/04804* (2013.01); *H01L 27/14678* (2013.01); *H01L 27/3234* (2013.01); *H01L 2251/5338* (2013.01)

(58) Field of Classification Search
    CPC ........ G06K 9/00013; H01L 2251/5338; H01L 27/14678; H01L 27/323; H01L 27/3234; H01L 27/3269; H01L 31/103; H01L 31/1136; H01L 51/0097
    See application file for complete search history.

(56) References Cited

U.S. PATENT DOCUMENTS

| | | | |
|---|---|---|---|
| 8,334,854 B2 | 12/2012 | Harada | |
| 8,451,241 B2 | 5/2013 | Kim et al. | |
| 8,537,082 B2 | 9/2013 | Takama et al. | |
| 8,638,030 B2 | 1/2014 | Lee et al. | |
| 8,796,702 B2 | 8/2014 | Kim et al. | |
| 8,635,926 B2 | 9/2014 | Yoon et al. | |
| 8,963,129 B2 | 2/2015 | Chung et al. | |
| 8,963,815 B2 | 2/2015 | Park | |
| 9,064,451 B2 | 6/2015 | Lynch et al. | |
| 9,679,513 B2 | 6/2017 | Lynch et al. | |
| 9,836,165 B2 | 12/2017 | Nho et al. | |
| 9,952,724 B2 | 4/2018 | Akimoto et al. | |
| 9,964,800 B2 | 5/2018 | Nakada et al. | |
| 10,056,029 B2 | 8/2018 | Lynch et al. | |
| 10,101,867 B2 | 10/2018 | Akimoto et al. | |
| 10,222,899 B2* | 3/2019 | Cao | G06F 3/0414 |
| 10,345,942 B2* | 7/2019 | Cho | G06F 3/042 |
| 2007/0291325 A1 | 12/2007 | Toyota et al. | |
| 2009/0153451 A1 | 6/2009 | Takama et al. | |
| 2009/0295692 A1 | 12/2009 | Lee et al. | |
| 2010/0103151 A1 | 4/2010 | Harada | |
| 2011/0096021 A1 | 4/2011 | Kim et al. | |
| 2011/0163661 A1* | 7/2011 | Lee | H01L 27/3227 313/504 |
| 2011/0205178 A1 | 8/2011 | Yoshida | |
| 2011/0220922 A1 | 9/2011 | Kim et al. | |
| 2011/0241014 A1 | 10/2011 | Yoon et al. | |
| 2011/0272675 A1 | 11/2011 | Chung et al. | |
| 2012/0168783 A1 | 7/2012 | Kim et al. | |
| 2012/0280894 A1 | 11/2012 | Park | |
| 2013/0194199 A1 | 8/2013 | Lynch et al. | |
| 2015/0220212 A1 | 8/2015 | Kim | |
| 2015/0287358 A1 | 10/2015 | Lynch et al. | |
| 2015/0301636 A1 | 10/2015 | Akimoto et al. | |
| 2015/0316958 A1 | 11/2015 | Takesue | |
| 2015/0331508 A1 | 11/2015 | Nho et al. | |
| 2017/0123564 A1 | 5/2017 | Cao | |
| 2017/0131594 A1 | 5/2017 | Nakada et al. | |
| 2017/0287392 A1 | 10/2017 | Lynch et al. | |
| 2018/0173349 A1 | 6/2018 | Cho et al. | |
| 2018/0203547 A1 | 7/2018 | Akimoto et al. | |

OTHER PUBLICATIONS

Non-Final Office Action dated Oct. 18, 2018, in U.S. Appl. No. 15/843,775.

* cited by examiner

DISPLAY PANEL AND DISPLAY DEVICE INCLUDING THE SAME

CROSS-REFERENCE TO RELATED APPLICATION

This application is a Continuation of U.S. patent application Ser. No. 15/843,775, filed Dec. 15, 2017, and claims priority from and the benefit of Korean Patent Application No. 10-2016-0172918, filed Dec. 16, 2016, each of which is hereby incorporated by reference for all purposes as if fully set forth herein.

BACKGROUND

Field

Exemplary embodiments relate to display technology, and, more particularly, to a transparent display panel capable of recognizing a user's touch and a user's fingerprint (or other epidermal information) and a transparent display device including the transparent display panel.

Discussion

A transparent display device has the same property as a transparent glass substrate when not in use, but displays information thereon when in use. The transparent display device itself may be used alone in some cases; however, in some cases, a real object in space behind the transparent display device is overlaid onto the image displayed on the transparent display device such that the transparent display device works in multiple ways. A head-up display HUD of an airplane or a vehicle is a representative example. Transparent display devices have been typically used only in an environment to which a high valued product is able to be applied, such as an airplane, a luxury car, and the like. However, demand for transparent display devices have gradually diversified from various advertisement displays to home appliances.

Meanwhile, a display device may recognize a user's finger or the like that makes contact with a screen through a touch sensing unit (or touch sensor). As a touch sensing method of the touch sensing unit, various types of sensing methods, e.g., a resistive type, an optical type, an electrostatic capacitive type, an infrared type, etc., have been suggested. Further, security issues on personal mobile terminals, such as smart phones, tablet PCs, etc., have arisen. As the mobile terminals of users have become frequently used, security is growing as a concern in e-commerce transactions through mobile terminals, and thus, biometric information like a fingerprint is drawing attention from the security industry.

The above information disclosed in this section is only for understanding the background of the inventive concepts, and, therefore, may contain information that does not form prior art.

SUMMARY

Some exemplary embodiments provide a transparent display panel capable of recognizing a user's touch and a user's fingerprint or other epidermal information, e.g., palm print, footprint, etc.

Some exemplary embodiments provide a transparent display device including the transparent display panel.

Additional aspects will be set forth in the detailed description which follows, and, in part, will be apparent from the disclosure, or may be learned by practice of the inventive concepts.

According to some exemplary embodiments, a display panel includes a base layer, a circuit layer, and a pixel layer. The base layer includes a plurality of light emitting areas, and a plurality of transmitting areas to transmit light incident thereto. The circuit layer includes a plurality of switching devices disposed on the light emitting areas, and a plurality of photosensors disposed on the transmitting areas. The pixel layer includes a light emitting element to emit light based on reception of a current from at least one of the plurality of switching devices. The light emitting element overlaps with one of the plurality of light emitting areas. At least one of the plurality of photosensors is configured to receive a portion of external light reflected from an external object after transmission of the external light through at least one of the plurality of transmitting areas According to some exemplary embodiments, a display device includes a display panel to transmit at least a portion of external light incident thereto. The display panel includes a plurality of pixels. At least one of the plurality of pixels includes: a light emitting area; a light emitting element to emit light, the light emitting element being disposed in the light emitting area; a transmitting area to transmit the external light incident thereto; and a photosensor disposed in the transmitting area. The light emitting element includes a reflective electrode overlapping with the light emitting area and disposed outside the transmitting area. The photosensor is configured to sense a portion of the external light reflected from an external object among transmission of external light through the transmitting area.

According to various exemplary embodiments, a transparent display panel and a transparent display device including the transparent display panel, which recognizes a user's touch and a user's fingerprint, may be provided.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
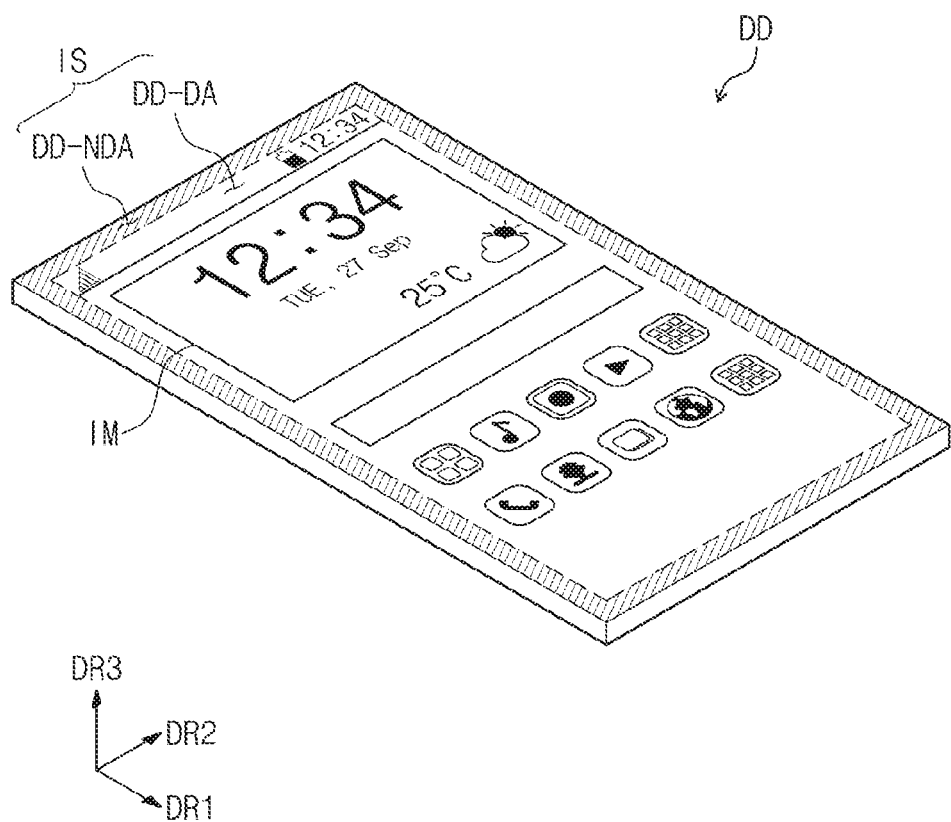
FIG. 1 is a perspective view showing a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the spirit and scope of the inventive concepts. Further, the blocks, units, and/or modules of some exemplary embodiments may be physically combined into more complex blocks, units, and/or modules without departing from the spirit and scope of the inventive concepts.

Figure 2:
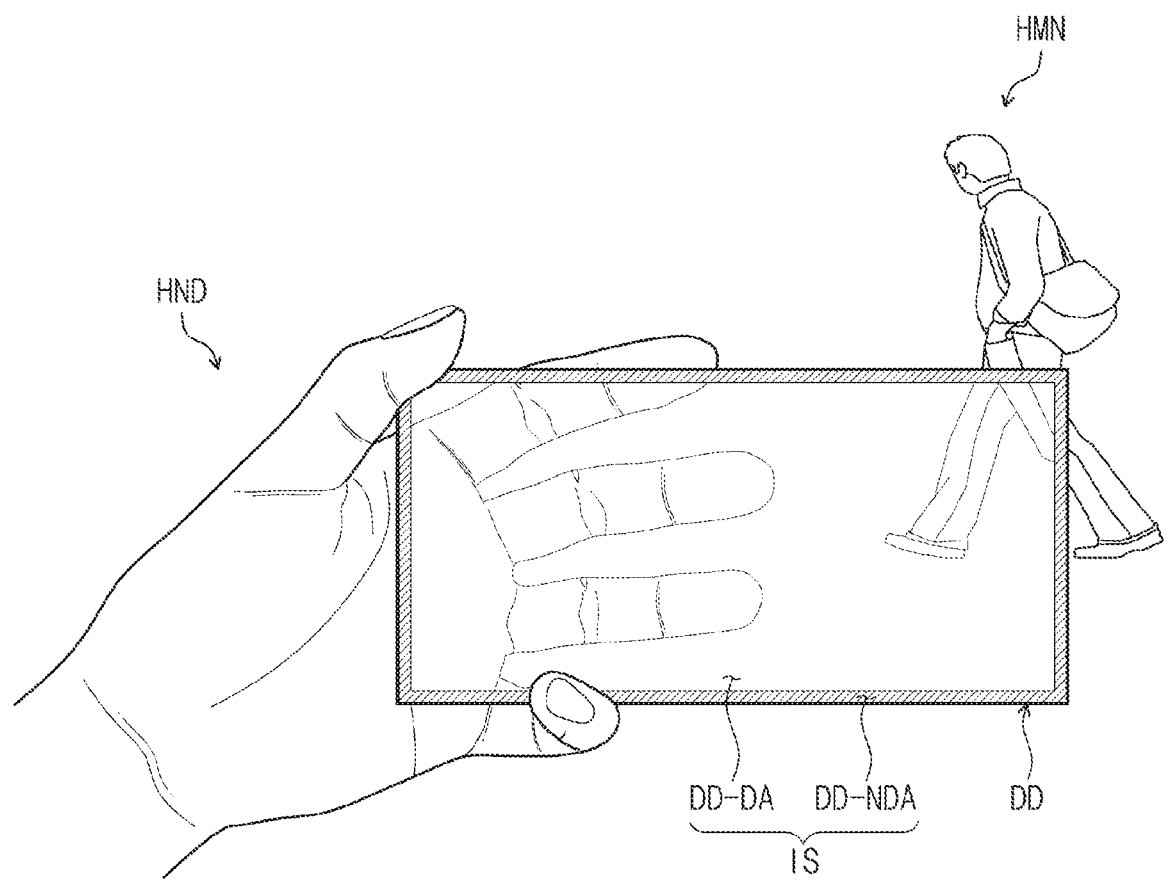
FIG. 2 is a view showing a gaze of a user utilizing the display device shown in FIG. 1 according to some exemplary embodiments.

FIG. 1 is a perspective view showing a display device DD according to some exemplary embodiments. FIG. 2 is a view showing a gaze of a user utilizing the display device DD shown in FIG. 1 according to some exemplary embodiments.

A display surface IS in which an image IM is displayed is substantially parallel to a surface defined by a first directional axis DR1 and a second directional axis DR2. A normal line direction of the display surface IS, i.e., a thickness direction of the display device DD, indicates a third directional axis DR3. In each member, a front surface (or an upper surface) is distinguished from a rear surface (or a lower surface) by the third directional axis DR3. However, the first to third directional axes DR1 to DR3 are relative to each other, and thus, the first to third directional axes DR1 to DR3 may be changed to any other directions. Hereinafter, first to third directions correspond to directions respectively indicated by the first to third directional axes DR1 to DR3, and thus, the first to third directions are assigned with the same reference numerals as the first to third directional axes DR1 to DR3.

The display device DD may be applied to a large-sized electronic item, such as a television set, a monitor, etc., and a small and medium-sized electronic item, such as a mobile phone, a tablet, a car navigation unit, a game unit, a smart watch, etc., but exemplary embodiments are not limited thereto or thereby.

Referring to FIG. 1, the display surface IS of the display device DD may include a plurality of areas. The display surface IS of the display device DD includes a display area DD-DA in which the image IM is displayed and a non-display area DD-NDA disposed adjacent to (e.g., outside of) the display area DD-DA. The non-display area DD-NDA does not display the image IM. FIG. 1 shows application icons as the image IM. The display area DD-DA has a substantially quadrangular shape, and the non-display area DD-NDA surrounds the display area DD-DA, but exemplary embodiments are not be limited thereto or thereby. That is, the shape of the display area DD-DA and the shape of the non-display area DD-NDA may be designed relative to each other.

Referring to FIG. 2, the display device DD is transparent, and a user sees objects behind the display device DD. The user who uses the display device DD may see a portion of a hand HND holding the display device DD behind the display device DD and a portion of a leg of a passenger HMN who passes behind the display device DD. In addition, in a case that the display device DD displays the image IM, the user may substantially simultaneously see the image IM and the objects behind the display device DD.

Figure 3:
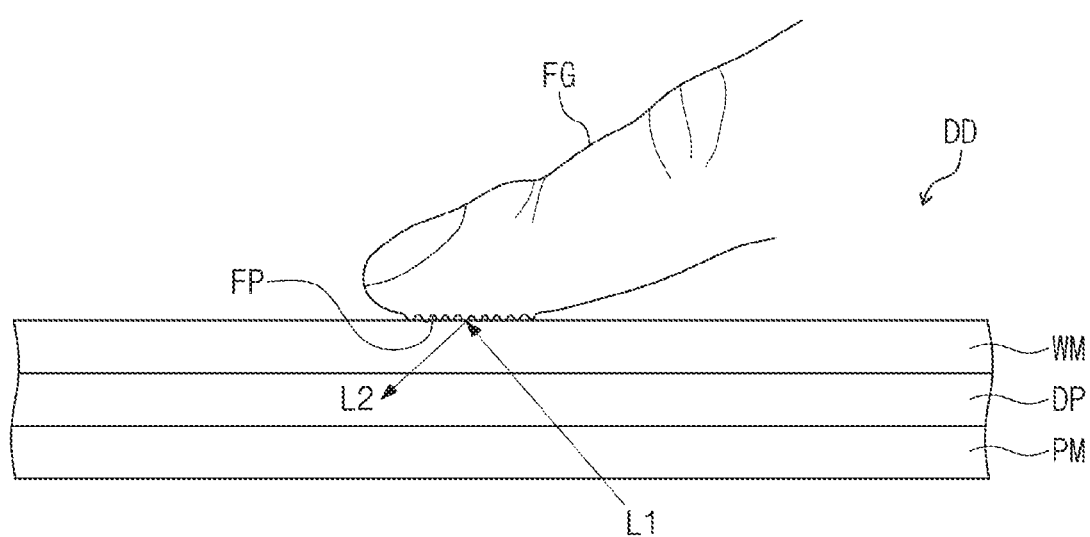
FIG. 3 is a view showing a portion, in cross-section, of the display device shown in FIG. 1 and a user's finger according to some exemplary embodiments.

FIG. 3 is a view showing a portion, in cross-section, of the display device DD shown in FIG. 1 and a user's finger FG according to some exemplary embodiments.

Referring to FIG. 3, the display device DD senses the user's touch. In addition, the display device DD recognizes the fingerprint FP of the user's finger FG. Although some exemplary embodiments are described in association with detection of a fingerprint, it is contemplated that various exemplary embodiments may be utilized to detect other three-dimensional patterns, such as other forms of epidermal ridges, such as a palm print, a footprint, and the like.

When an external light L1 (hereinafter, referred to as a "first light") is incident into the display device DD, the first light L1 reaches the user's finger FG after passing through the display device DD. A light L2 (hereinafter, referred to as a "second light") generated by the first light L1 after being reflected by the user's finger FG reaches the display panel DP. The display panel DP may sense whether the user's touch occurs or the fingerprint FP of the user's finger FG by measuring a variation in intensity of the second light L2.

In some exemplary embodiments, an area in which the fingerprint FP is recognized may be substantially the same as the display area DD-DA. That is, when the fingerprint FP of the user's finger FG makes contact with the display area DD-DA, the display device DD may recognize the fingerprint FP. However, in some exemplary embodiments, only a portion of the display area DD-DA may be used to recognize the fingerprint FP.

The display device DD may recognize the fingerprint FP of the user to determine whether the user is a legitimate user. In addition, the fingerprint FP of the user may be used for security of mobile devices, financial transactions, control of systems, and the like.

The display device DD includes a protective film PM, a window WM, and the display panel DP, but exemplary embodiments are not limited thereto or thereby. The protective film PM and the window WM may be replaced (or augmented) with other layers or omitted.

The display panel DP is disposed between the protective film PM and the window WM. The display device DD may further include a first adhesive member (not shown) and a second adhesive member (not shown). The first adhesive member attaches the protective film PM to the display panel DP, and the second adhesive member attaches the window WM to the display panel DP. In some exemplary embodiments, the protective film PM and the window WM may be consecutively formed through a coating process. For instance, the protective film PM and/or the window WM may be grown on one or more surfaces of the display panel DP.

In some exemplary embodiments, each of the first and second adhesive members may be an optically clear adhesive (OCA) film, an optically clear resin (OCR), or a pressure sensitive adhesive (PSA) film. In some exemplary embodiments, each of the first and second adhesive members may include a light-curable adhesive material or a heat-curable adhesive material, but exemplary embodiments are not limited thereto or thereby.

The protective film PM protects the display panel DP. The protective film PM prevents (or reduces) an external moisture (or other contaminant) from entering the display panel DP, and absorbs an external impact. The protective film PM may include a plastic film as a base layer thereof. For instance, the protective film PM may include a plastic film including at least one of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly (arylene ethersulfone), and a combination thereof. The material for the protective film PM is not limited to plastic resins and may include a composite of organic and inorganic materials. The protective film PM may include a porous organic layer and an inorganic material filled in pores of the organic layer. The protective film PM may further include a functional layer formed on the plastic film. The functional layer may include a resin layer. The functional layer may be formed by a coating or growth process.

The window WM protects the display panel DP from the external impact and provides a touch sensing surface to the user. The display surface IS shown in FIGS. 1 and 2 may be the touch sensing surface used to sense whether the user's touch occurs. In addition, the display surface IS may be a fingerprint recognition surface used to recognize the fingerprint of the user.

The display panel DP generates the image IM (refer to FIG. 1) corresponding to image data input thereto. A process of manufacturing the display panel DP may include a low temperature polycrystalline silicon (LTPS) process or a low temperature polycrystalline oxide (LTPO) process.

Although not shown in figures, the display device DD may further include a touch sensing unit disposed on (or provided as part of) the display panel DP according to another exemplary embodiment. The touch sensing unit may obtain coordinate information with respect to an external input.

Although not shown in figures, the display device DD may further include an anti-reflective layer disposed on the display panel DP. The anti-reflective layer may include at least one of color filter, a stacking structure of a conductive layer/a dielectric layer/a conductive layer, and an optical member. The anti-reflective layer absorbs, destructively interferes, and/or polarizes the external light incident thereto to reduce a reflectance of the external light.

Figure 4:
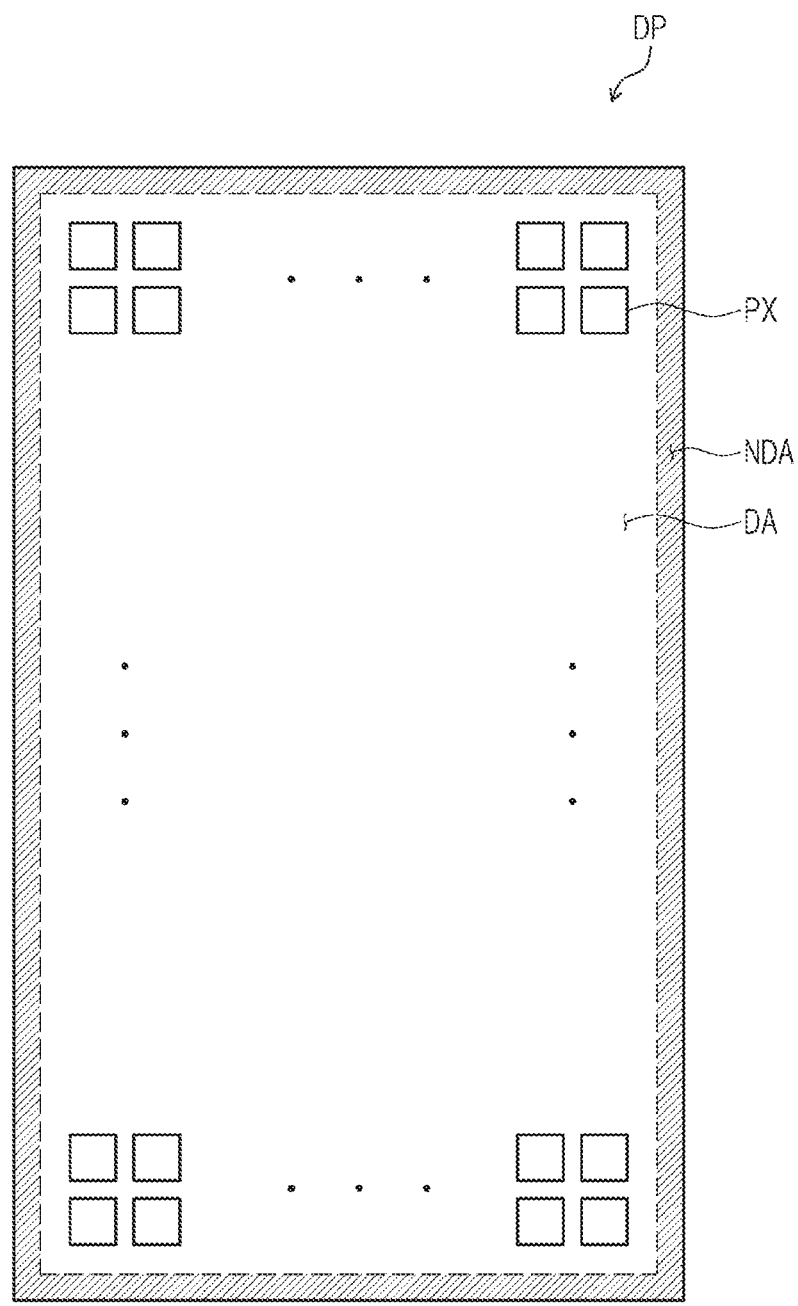
FIG. 4 is a plan view showing a display panel shown in FIG. 3 according to some exemplary embodiments.
Figure 5:
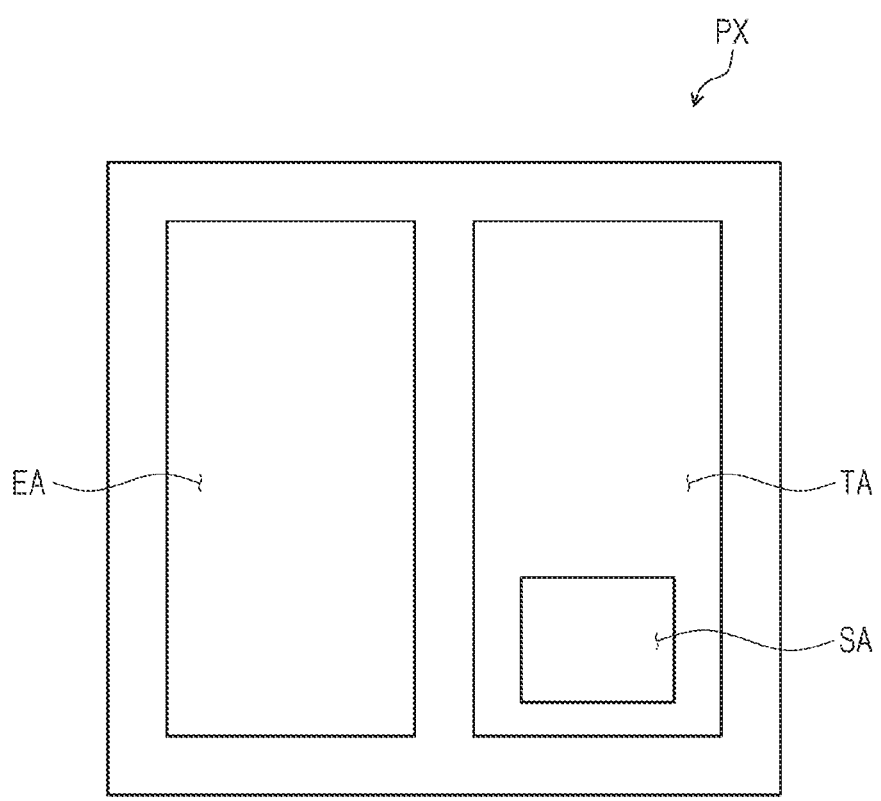
FIG. 5 is an enlarged plan view showing a pixel shown in FIG. 4 according to some exemplary embodiments.
Figure 6:
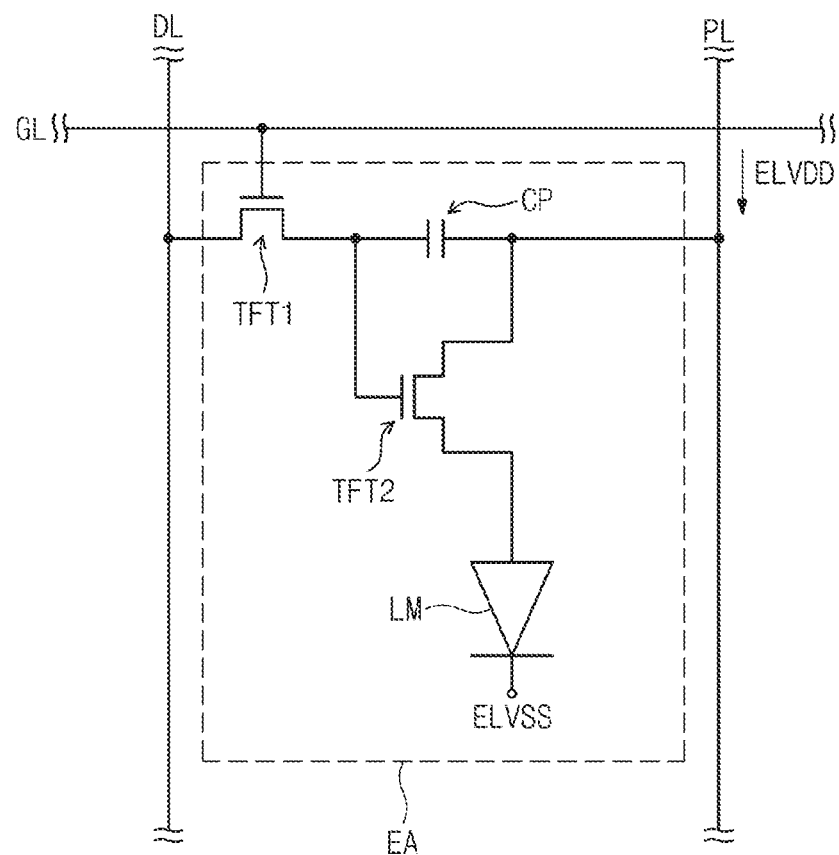
FIG. 6 is an equivalent circuit diagram corresponding to a light emitting area shown in FIG. 5 according to some exemplary embodiments.

FIG. 4 is a plan view showing the display panel DP shown in FIG. 3 according to some exemplary embodiments. FIG. 5 is an enlarged plan view showing a pixel PX shown in FIG. 4 according to some exemplary embodiments. FIG. 6 is an equivalent circuit diagram corresponding to a light emitting area EA shown in FIG. 5 according to some exemplary embodiments.

Referring to FIG. 4, the display panel DP includes a display area DA and a non-display area NDA when viewed in a plan view. The display area DA and the non-display area NDA of the display panel DP respectively correspond to the display area DD-DA (refer to FIG. 1) and the non-display area DD-NDA (refer to FIG. 1) of the display device DD (refer to FIG. 1). The display area DA and the non-display area NDA of the display panel DP need not be the same as the display area DD-DA and the non-display area DD-NDA of the display device DD, and the display area DA and the non-display area NDA of the display panel DP may be changed depending on the structure and design of the display panel DP.

The display panel DP includes a plurality of pixels PX. An area in which the pixels PX are arranged is defined as the display area DA. In some exemplary embodiments, the non-display area NDA may be defined along an edge of the display area DA.

Referring to FIG. 5, each pixel PX includes a light emitting area EA and a transmitting area TA. The transmitting area TA includes a sensing area SA.

The light emitting area EA corresponds to an area from which a light generated by the display panel DP exits. The transmitting area TA corresponds to an area through which the first light L1 or the second light L2 transmits. Due to the transmitting area TA, the display device DD may become transparent such that the user sees the objects behind the display device DD as shown in FIG. 2. The sensing area SA corresponds to an area used to sense a variation of the second light L2 incident thereto. As shown in FIG. 3, the user's touch or the fingerprint FP of the user may be recognized through the sensing area SA.

FIG. 6 shows an exemplary equivalent circuit (hereinafter, referred to as a "light emitting circuit") of the light emitting area EA, which is connected to one gate line GL, one data line DL, and a power line PL, but configurations of the light emitting circuit are not limited thereto or thereby. In other words, any suitable light emitting circuit may be utilized.

The gate line GL is connected to a first portion of a corresponding component (e.g., a first electrode of first transistor TFT1) of the light emitting circuit and the data line DL is connected to another portion of the corresponding component (e.g., a second electrode of the first transistor TFT1) of the light emitting circuit. Although not shown in the figures, a gate driving circuit connected to the gate line GL may be disposed at one end portion of the non-display area NDA (refer to FIG. 4).

The light emitting circuit includes a light emitting element LM. The light emitting element LM may be a front surface light emitting type diode, a rear surface light emitting type diode, or a both surface light emitting type diode. The light emitting element LM may be an organic light emitting diode. The light emitting circuit also includes a first transistor TFT1 (or a switching transistor), a second transistor TFT2 (or a driving transistor), and a capacitor CP to drive the light emitting element LM. The light emitting element LM generates light in response to an electrical signal provided from the first and second transistors TFT1 and TFT2.

The first transistor TFT1 outputs a data signal provided through the data line DL in response to a scan signal provided through the gate line GL. The capacitor CP is charged with a voltage corresponding to the data signal provided from the first transistor TFT1.

The second transistor TFT2 is connected to the light emitting element LM. The second transistor TFT2 controls a driving current flowing through the light emitting element LM in response to an amount of electric charge held in the capacitor CP. The driving current may also be related to a difference in potential between an input voltage line first power level ELVDD and a second power level ELVSS. The light emitting element LM emits the light during a turn-on period of the second transistor TFT2.

Figure 7:
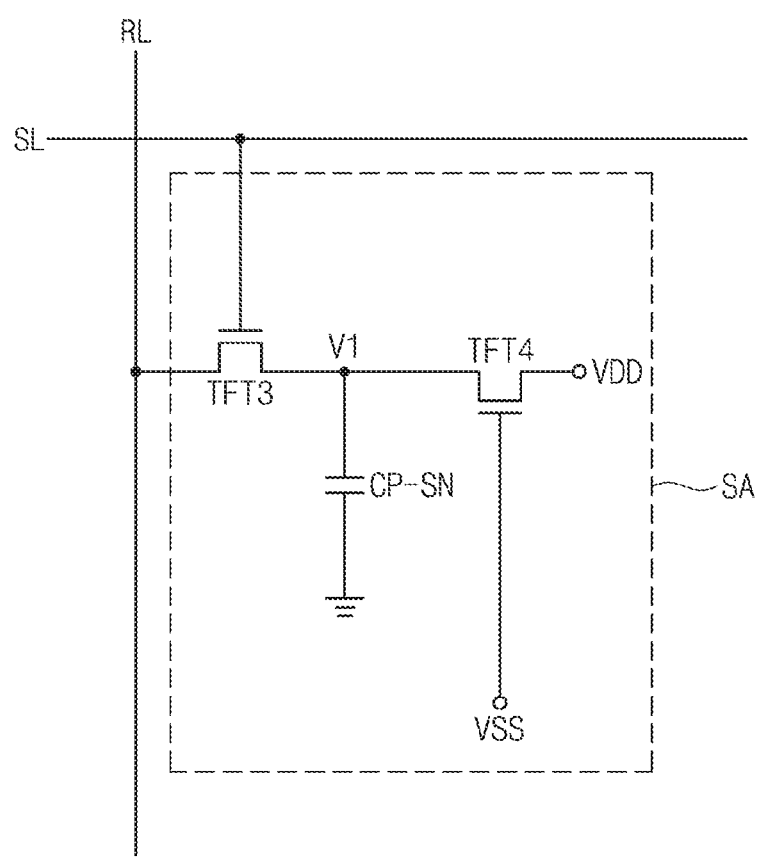
FIG. 7 is an equivalent circuit diagram corresponding to a sensing area shown in FIG. 5 according to some exemplary embodiments.

FIG. 7 is an equivalent circuit diagram corresponding to the sensing area SA shown in FIG. 5 according to some exemplary embodiments.

FIG. 7 shows an exemplary equivalent circuit (hereinafter, referred to as a "sensing circuit") of the sensing area SA, which is connected to one scan line SL and one readout line RL, but configurations of the sensing circuit are not limited thereto or thereby.

The scan line SL is connected to a first portion of a corresponding component (e.g., a first electrode of third transistor TFT3) of the sensing circuit, and the data line DL is connected to a second portion of the corresponding component (e.g., a second electrode of the third transistor TFT3) of the sensing circuit. Although not shown in the figures, a scan driving circuit connected to the scan line SL and a readout circuit connected to the readout line RL may be disposed at one end portion of the non-display area NDA (refer to FIG. 4). In some exemplary embodiments, the scan driving circuit and the readout circuit may be integrally formed with the circuit used to drive the light emitting circuit.

The scan signal is sequentially applied to scan lines SL, and readout lines RL receive signals output from the sensing circuit and provide the signals to a readout circuit (not shown). According to another exemplary embodiment, the signals output from the sensing circuit may be applied to other circuits (not shown) that process the output signals.

The sensing circuit includes a third transistor TFT3, a fourth transistor TFT4, and a sensing capacitor CP-SN.

The third transistor TFT3 serves as a switching device and includes a control electrode connected to the scan line SL, an output electrode connected to the readout line RL, and an input electrode connected to a node V1, which is connected to the sensing capacitor CP-SN. Meanwhile, the fourth transistor TFT4 includes an input electrode connected to an input voltage line VDD, an output electrode connected to the node V1, which is connected to the sensing capacitor CP-SN, and a control electrode connected to a common voltage line VSS.

When the second light L2 (refer to FIG. 3) is applied to the fourth transistor TFT4, a semiconductor of a channel part (which includes, for example, amorphous silicon or polycrystalline silicon) forms a current, and the current flows toward the sensing capacitor CP-SN and the third transistor TFT3 by the input voltage input to the input voltage line VDD. That is, the fourth transistor TFT4 is a phototransistor. The phototransistor is a kind of optical sensor that converts light energy to electrical energy, and the phototransistor uses a photo-electromotive force in which a flowing current is changed depending on the intensity of incident light. When the signal is input to the scan line SL, the current flows through the readout line RL.

In some exemplary embodiments, the number of the light emitting circuits may be different from the number of the sensing circuits. The number of the light emitting circuits may be smaller than the number of the sensing circuits, but exemplary embodiments are not limited thereto or thereby.

Figure 8:
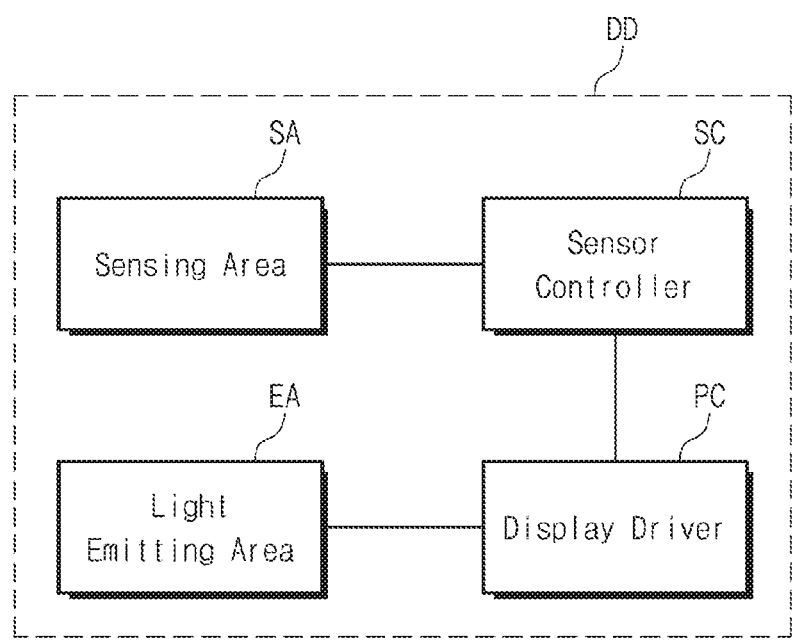
FIG. 8 is a block diagram showing a display device shown in FIG. 1 according to some exemplary embodiments.

FIG. 8 is a block diagram showing the display device DD shown in FIG. 1 according to some exemplary embodiments. Referring to FIG. 8, the display device DD may further include a sensor controller SC and a display driver PC.

The sensor controller SC may control the sensing area SA and sense an amount of light variation in the sensing area SA to sense the touch or the fingerprint FP of the user.

The display driver PC may provide an image driving signal to the light emitting area EA to control an image display operation of the display panel DP. To this end, the display driver PC may generate the image driving signal using image data and a control signal, which are provided from the outside, e.g., an outside source. For instance, the display driver PC may receive the image data and the control signal from a host (not shown), and the control signal may include a vertical synchronization signal, a horizontal synchronization signal, a main clock signal, and the like. In addition, the image driving signal may include the scan signal and the data signal generated using the image data.

The sensor controller SC and the display driver PC may be integrated into one configuration. As an example, the sensor controller SC and the display driver PC may be implemented by one integrated circuit (IC).

Figure 9:
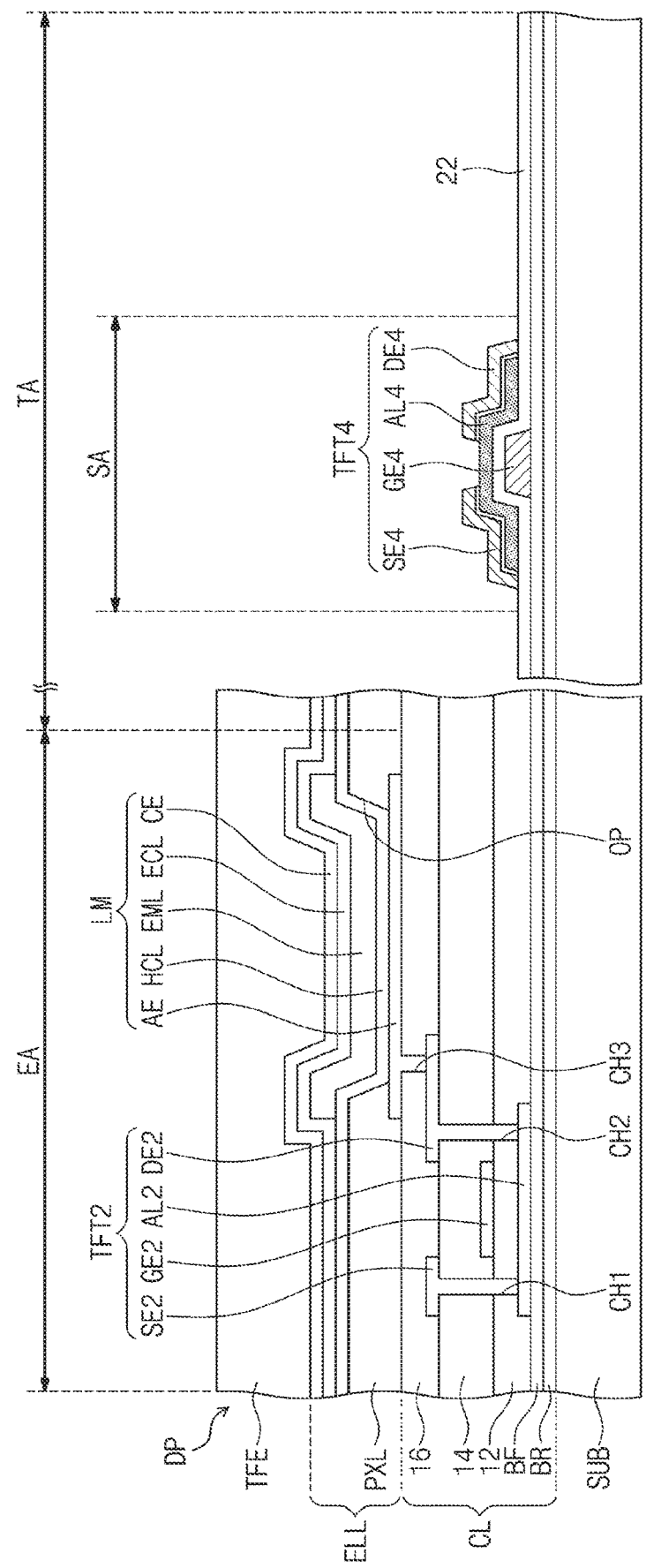
FIG. 9 is a cross-sectional view showing a portion of a display panel shown in FIG. 3 according to some exemplary embodiments.

FIG. 9 is a cross-sectional view showing a portion of the display panel DP shown in FIG. 3 according to some exemplary embodiments. That is, FIG. 9 shows a portion of the light emitting area EA and a portion of the transmitting area TA of FIG. 5.

According to the cross-section corresponding to the portion of the light emitting area EA, the display panel DP includes a base layer SUB, a circuit layer CL, a pixel layer ELL, and a thin film encapsulation layer TFE.

The base layer SUB may include at least one of an organic material and an inorganic material. The base layer SUB may transmit at least a portion of the light incident thereto. In some exemplary embodiments, the display panel DP includes the light emitting area EA and the transmitting area TA since the base layer SUB includes the light emitting area EA and the transmitting area TA. That is, the light emitting area EA of the display panel DP may be defined depending on which components are disposed in the light emitting area EA of the base layer SUB, and the transmitting area TA of the display panel DP may be defined depending on which components are disposed in the transmitting area TA of the base layer SUB.

Functional layers may be disposed on a surface of the base layer SUB. The functional layers may include at least one of a barrier layer BR and a buffer layer BF. A second semiconductor pattern AL2 may be disposed on the barrier layer BR or the buffer layer BF. However, according to another exemplary embodiment, the functional layers may be replaced with other layers or omitted.

The circuit layer CL may be disposed on the base layer SUB. According to an exemplary embodiment, the second semiconductor pattern AL2 of the second transistor TFT2 may be disposed on the base layer SUB. The second semiconductor pattern AL2 may include, for instance, amorphous silicon, polysilicon, or a metal oxide semiconductor.

The circuit layer CL includes organic/inorganic layers (e.g., barrier layer BR, buffer layer BF, first insulating layer 12, second insulating layer 14, and/or third insulating layer 16) and the second transistor TFT2. Although not shown in the figures, the circuit layer CL may include the first transistor TFT1 (refer to FIG. 5) and the capacitor CP (refer to FIG. 5).

The transmitting area TA of the circuit layer CL may transmit at least a portion of light incident thereto. The transmitting area TA of the circuit layer CL may include the fourth transistor TFT4. Although not shown in the figures, the circuit layer CL may include the third transistor TFT3 (refer to FIG. 7) and the sensing capacitor CP-SN (refer to FIG. 7).

The first insulating layer 12 may be disposed on the base layer SUB to cover the second semiconductor pattern AL2. The first insulating layer 12 includes an organic layer and/or an inorganic layer. For instance, the first insulating layer 12 may include a plurality of inorganic thin layers. The inorganic thin layers may include at least one of a silicon nitride layer, a silicon oxynitride layer, and a silicon oxide layer.

A control electrode GE2 (hereinafter, referred to as a "second control electrode") of the second transistor TFT2 is disposed on the first insulating layer 12. The second control electrode GE2 may be formed through the same photolithography process as the gate line GL (refer to FIG. 6). In other words, the second control electrode GE2 may include the same material and stacking structure as those of the gate line GL, and the second control electrode GE2 may be disposed on (or in) the same layer as the gate line GL.

The second insulating layer 14 is disposed on the first insulating layer 12 to cover the second control electrode GE2. The second insulating layer 14 includes an organic layer and/or an inorganic layer. For example, the second insulating layer 14 may include a plurality of inorganic thin layers. The inorganic thin layers may include at least one of a silicon nitride layer, a silicon oxynitride layer, and a silicon oxide layer.

An input electrode SE2 (hereinafter, referred to as a "second input electrode") and an output electrode DE2 (hereinafter, referred to as "second output electrode") of the second transistor TFT2 are disposed on the second insulating layer 14. The second input electrode SE2 may be branched from the power line PL (refer to FIG. 6).

The second input electrode SE2 and the second output electrode DE2 may be formed through the same photolithography process as the data line DL (refer to FIG. 6) and the power line PL (refer to FIG. 6). The second input electrode SE2 and the second output electrode DE2 may include the same material and the same stacking structure as those of the data line DL and the power line PL, and the second input electrode SE2 and the second output electrode DE2 may be disposed on (or in) the same layer as the data line DL and the power line PL.

The second input electrode SE2 and the second output electrode DE2 are connected to the second semiconductor pattern AL2 respectively through a first contact hole CH1 and a second contact hole CH2 that are defined through the first insulating layer 12 and the second insulating layer 14. Meanwhile, according to another exemplary embodiment, the second transistor TFT2 may have a bottom gate structure or a dual gate structure.

The third insulating layer 16 is disposed on the second insulating layer 14 to cover the second input electrode SE2 and the second output electrode DE2. The third insulating layer 16 includes an organic layer and/or an inorganic layer. For instance, the third insulating layer 16 may include an organic material to provide a flat surface, e.g., a flat or planar upper surface.

One of the first insulating layer 12, the second insulating layer 14, and the third insulating layer 16 may be omitted depending on a circuit configuration of the pixel. Each of the second insulating layer 14 and the third insulating layer 16 may be defined as an interlayer insulating layer. The interlayer insulating layer is disposed between a conductive pattern disposed above the interlayer insulating layer and a conductive pattern disposed under the interlayer insulating layer to insulate the conductive patterns from each other.

The pixel layer ELL is disposed on the third insulating layer 16. The pixel layer ELL includes a pixel definition layer PXL and the light emitting element LM. An anode AE is disposed on the third insulating layer 16. The anode AE is connected to the second output electrode DE2 through a third contact hole CH3 defined through the third insulating layer 16. The pixel definition layer PXL is provided with an opening OP formed therethrough. At least a portion of the anode AE is exposed through the opening OP of the pixel definition layer PXL.

In some exemplary embodiments, the anode AE may be a reflective electrode that reflects light generated by a light emitting layer EML. The anode AE is disposed only in the light emitting area EA without being disposed in the transmitting area TA. Since the transmitting area TA of the display panel DP does not include the anode AE, the transmitting area TA may have a property that transmits the light.

A hole control layer HCL may be disposed on the anode AE. The light emitting layer EML is disposed on the hole control layer HCL. The light emitting layer ELM may be disposed only in an area corresponding to the opening OP. That is, the light emitting layer EML may be provided to each of the pixels PX. The light emitting layer EML may include an organic material or an inorganic material.

An electron control layer ECL is disposed on the light emitting layer EML. A cathode CE is disposed on the electron control layer ECL. The cathode CE may be commonly disposed on the pixels PX.

In some exemplary embodiments, the light emitting layer EML is patterned, but the light emitting layer EML may be commonly disposed on the pixels PX without being patterned. According to one or more exemplary embodiments, the light emitting layer EML may generate at least one of a blue light, a red light, and a green light. According to another exemplary embodiment, the light emitting layer EML may generate a white light. In addition, the light emitting layer EML may have a multi-layer structure.

In some exemplary embodiments, the thin film encapsulation layer TFE may directly cover the cathode CE. According to another exemplary embodiment, the thin film encapsulation layer TFE may be disposed on the pixel layer ELL by a separate adhesive.

According to some exemplary embodiments, a capping layer may be provided to cover the cathode CE. In this case, the thin film encapsulation layer TFE may directly cover the capping layer. The thin film encapsulation layer TFE may include an organic layer including an organic material, and an inorganic layer including an inorganic material. That is, the thin film encapsulation layer TFE may have a multilayer structure including one or more organic and/or inorganic layers.

The transmitting area TA of the pixel layer ELL may transmit at least a portion of light incident thereto. According to the cross-section corresponding to the portion of the transmitting area TA, the transmitting area TA includes the sensing area SA.

Referring to the sensing area SA, a control electrode GE4 (hereinafter, referred to as a "fourth control electrode") of the fourth transistor TFT4 is disposed on the base layer SUB.

In some exemplary embodiments, the fourth control electrode GE4 may be formed through the same process as the second control electrode GE2.

A fourth insulating layer 22 is disposed on the base layer SUB to cover the fourth control electrode GE4. The fourth insulating layer 22 includes an organic layer and/or an inorganic layer. For instance, the fourth insulating layer 22 may include a plurality of inorganic thin layers. The inorganic thin layers may include at least one of a silicon nitride layer, a silicon oxynitride layer, and a silicon oxide layer. In some exemplary embodiments, the fourth insulating layer 22 may be substantially the same as the first insulating layer 12, the second insulating layer 14, or the third insulating layer 16.

A semiconductor pattern AL4 (hereinafter, referred to as a "fourth semiconductor pattern") of the fourth transistor TFT4 is disposed on the fourth insulating layer 22. The fourth semiconductor pattern AL4 may include, for example, amorphous silicon, polysilicon, or a metal oxide semiconductor.

An input electrode SE4 (hereinafter, referred to as a "fourth input electrode") and an output electrode DE4 (hereinafter, referred to as a "fourth output electrode") of the fourth transistor TFT4 are disposed to overlap with a portion of the fourth semiconductor pattern AL4.

Although not shown in the figures, an insulating layer may be disposed on the fourth insulating layer 22 to cover the fourth input electrode SE4 and the fourth output electrode DE4.

Referring to FIGS. 3 and 9, the first light L1 incident from the outside of the display device DD reaches the fingerprint FP of the user's finger FG through the transmitting area TA. The first light L1 becomes the second light L2 after being reflected by the fingerprint FP. The second light L2 reaches the fourth semiconductor pattern AL4 of the fourth transistor TFT4 of the sensing area SA of the display panel DP. The fourth transistor TFT4 senses the variation in the second light L2 and recognizes the fingerprint FP. In a case that the fingerprint FP positioned above the display panel DP is recognized, the fourth transistor TFT4 may have a bottom gate structure to easily sense the variation of the second light L2 through the fourth semiconductor pattern AL4; however, exemplary embodiments are not limited thereto or thereby.

In some exemplary embodiments, portions overlapped with the fourth transistor TFT4 among the layers disposed above the fourth transistor TFT are partially removed, and thus, a light transmittance of the display panel DP may be improved.

Figure 10:
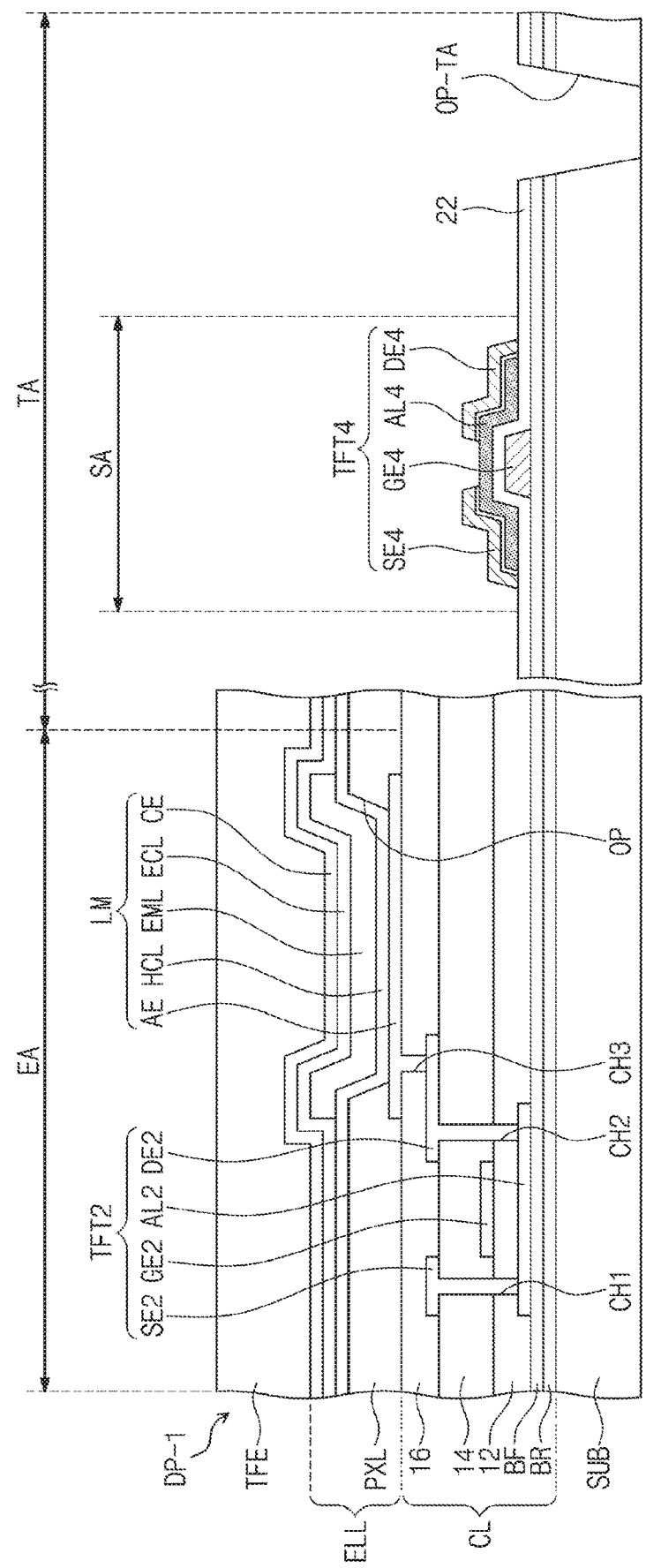
FIGS. 10, 11, and 12 are cross-sectional views respectively showing portions of display panels according to various exemplary embodiments.
Figure 11:
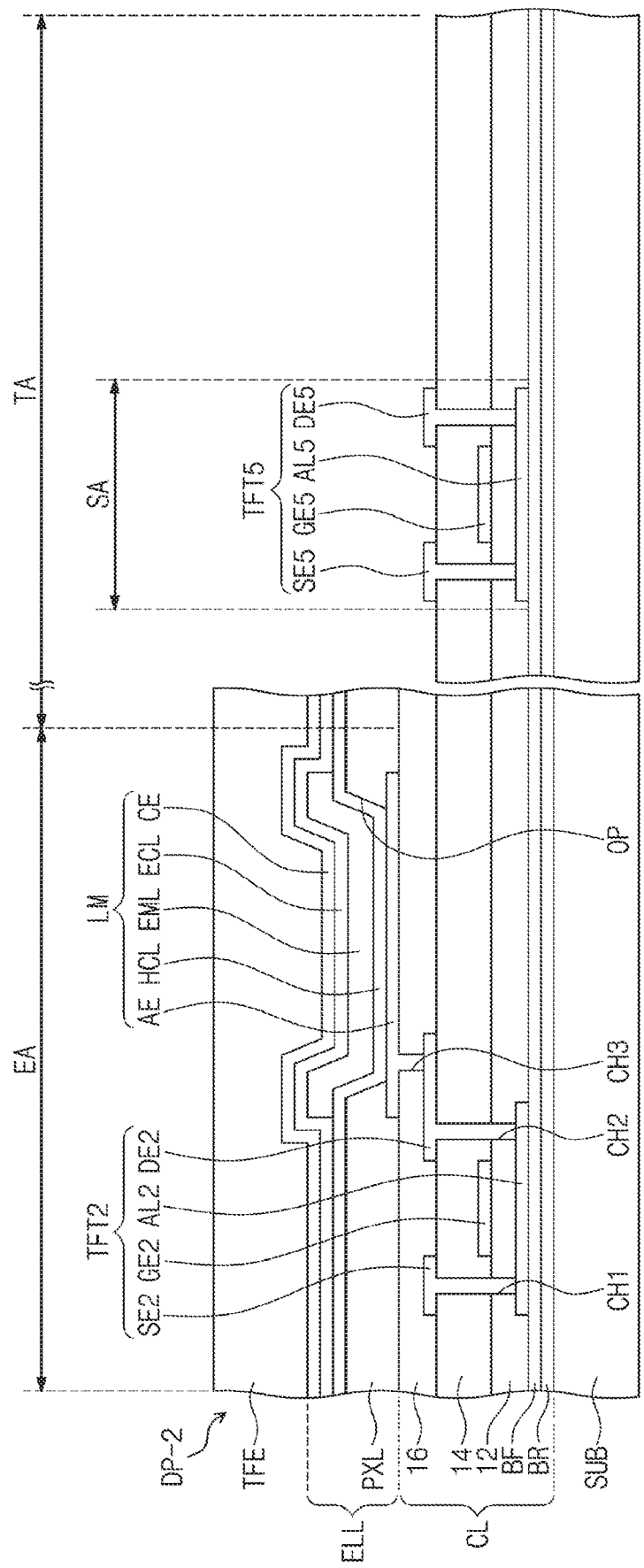
Figure 12:
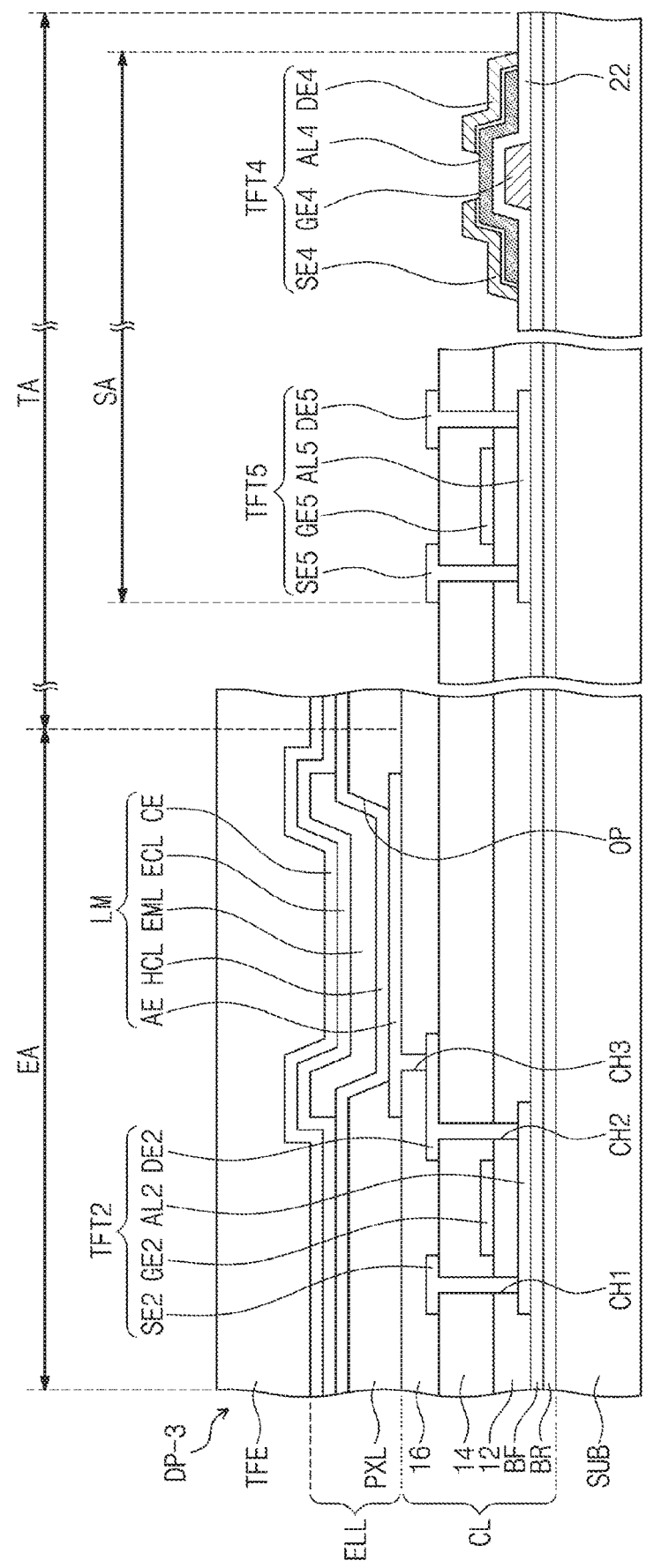

FIGS. 10, 11, and 12 are cross-sectional views respectively showing portions of display panels DP-1, DP-2, and DP-3 according to some exemplary embodiments.

Referring to FIG. 10, an opening OP-TA may be defined through a transmitting area TA of the display panel DP-1. In some exemplary embodiments, the opening OP-TA may be defined through the base layer SUB, the functional layers (e.g., the barrier layer BR and the buffer layer BF), and the fourth insulating layer 22, but exemplary embodiments are not limited thereto or thereby. That is, according to another exemplary embodiment, the opening OP-TA may be defined through only one of the base layer SUB, the functional layers, and the fourth insulating layer 22.

The opening OP-TA allows external light to easily transmit through the display panel DP-1, and thus, the light transmittance of the display panel DP-1 may be improved. Accordingly, the display device DD with high transparency may be provided to the user. Since descriptions of other components of the display panel DP-1 are the same as those described in FIG. 9, details thereof will be omitted.

Referring to FIG. 11, a sensing area SA of the display panel DP-2 may include a fifth transistor TFT5.

A semiconductor pattern AL5 (hereinafter, referred to as a "fifth semiconductor pattern") of the fifth transistor TFT5 may be disposed on the sensing area SA of the base layer SUB. The first insulating layer 12 may be disposed on the base layer SUB to cover the fifth semiconductor pattern AL5.

A control electrode GE5 (hereinafter, referred to as a "fifth control electrode") of the fifth transistor TFT5 is disposed on the first insulating layer 12. The fifth control electrode GE5 may be formed through the same photolithography process as the second control electrode GE2. The second insulating layer 14 is disposed on the first insulating layer 12 to cover the fifth control electrode GE5.

An input electrode SE5 (hereinafter, referred to as a "fifth input electrode") and an output electrode DE5 (hereinafter, referred to as a "fifth output electrode") of the fifth transistor TFT5 are disposed on the second insulating layer 14. The fifth input electrode SE5 and the fifth output electrode DE5 may be formed through the same photolithography process as the second input electrode SE2 and the second output electrode DE2.

Although not shown in the figures, an insulating layer may be disposed on the second insulating layer 14 to cover the fifth input electrode SE5 and the fifth output electrode DE5.

Different from the above-described display panels DP and DP-1, the display panel DP-2 shown in FIG. 11 may recognize the user's touch or the fingerprint of the user that occur on a lower portion of the display panel DP-2. In this case, the external light is incident to the display panel DP-2 from above or over the display panel DP-2 and reflected by the fingerprint disposed under the display panel DP2, and thus, reflected light is generated. Since the reflected light is incident to the display panel DP-2 from below the display panel DP-2, the fifth transistor TFT5 may have a top gate structure in which the fifth semiconductor pattern AL5 is disposed at a lower portion of the fifth transistor TFT5. Descriptions of other components of the display panel DP-2 are the same as those described in FIG. 9, and thus, details thereof will be omitted.

Referring to FIG. 12, a sensing area SA of the display panel DP-3 may include the fourth transistor TFT4 and the fifth transistor TFT5. The fourth transistor TFT4 has the same structure and function as those described in FIG. 9, and the fifth transistor TFT5 has the same structure and function as those described in FIG. 11. In addition, descriptions of other components of the display panel DP-3 are the same as those described in FIGS. 9 and 11, and thus, details thereof will be omitted.

Different from the display panels DP, DP-1, and DP-2, the display panel DP-3 shown in FIG. 12 may recognize the user's touch or the fingerprint of the user, which occurs above and/or below the display panel DP-3. The display device DD may recognize the user's touch or the fingerprint of the user that occurs above the display panel DP-3 through the fourth transistor TFT4. In addition, the display device DD may recognize the user's touch or the fingerprint of the user that occurs below the display panel DP-3 through the fifth transistor TFT5.

FIGS. 13, 14, 15, and 16A are enlarged plan views respectively showing pixels PX-1, PX-2, PX-3, and PX-4 according to various exemplary embodiments. FIG. 16B is an equivalent circuit diagram corresponding to an auxiliary light emitting area UA of FIG. 16A according to some exemplary embodiments.

Figure 13:
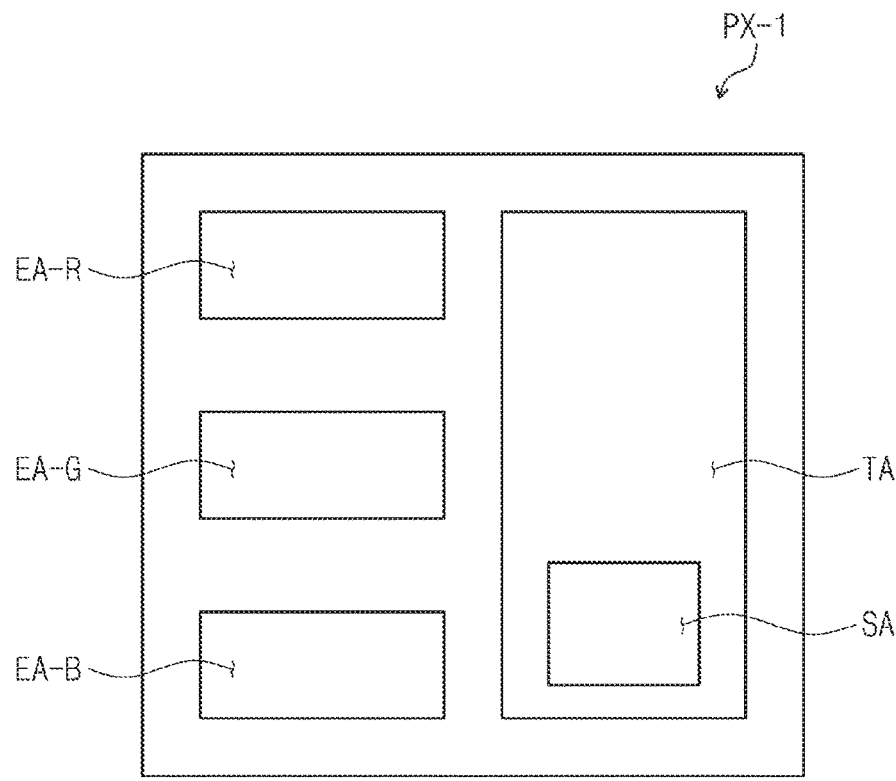
FIGS. 13, 14, 15, and 16A are enlarged plan views respectively showing pixels according to various exemplary embodiments.

Referring to FIG. 13, the pixel PX-1 may include a plurality of light emitting areas EA-R, EA-G, and EA-B and the transmitting area TA.

The transmitting area TA and the sensing area SA may correspond (or be disposed in relation) to the light emitting areas EA-R, EA-G, and EA-B. The light emitting areas EA-R, EA-G, and EA-B may include a red light emitting area EA-R, a green light emitting area EA-G, and a blue light emitting area EA-B. The red light emitting area EA-R, the green light emitting area EA-G, and the blue light emitting area EA-B may be arranged in a straight line, but the arranged order and/or alignment of the red light emitting area EA-R, the green light emitting area EA-G, and the blue light emitting area EA-B are not particularly limited.

Figure 14:
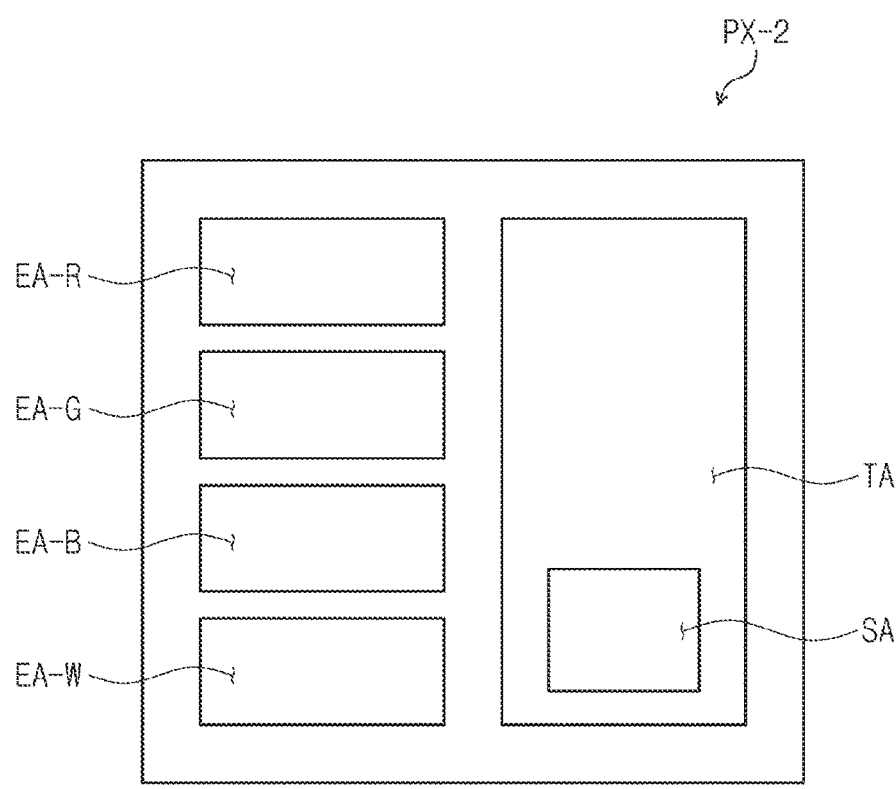

Referring to FIG. 14, the pixel PX-2 may include a plurality of light emitting areas EA-R, EA-G, EA-B, and EA-W and the transmitting area TA.

The transmitting area TA and the sensing area SA may correspond to the light emitting areas EA-R, EA-G, EA-B, and EA-W. The light emitting areas EA-R, EA-G, EA-B, and EA-W may include a red light emitting area EA-R, a green light emitting area EA-G, a blue light emitting area EA-B, and a white light emitting area EA-W. The red light emitting area EA-R, the green light emitting area EA-G, the blue light emitting area EA-B, and the white light emitting area EA-W may be arranged in a straight line, but the arranged order and/or alignment of the red light emitting area EA-R, the green light emitting area EA-G, the blue light emitting area EA-B, and the white light emitting area EA-W are not particularly limited.

Figure 15:
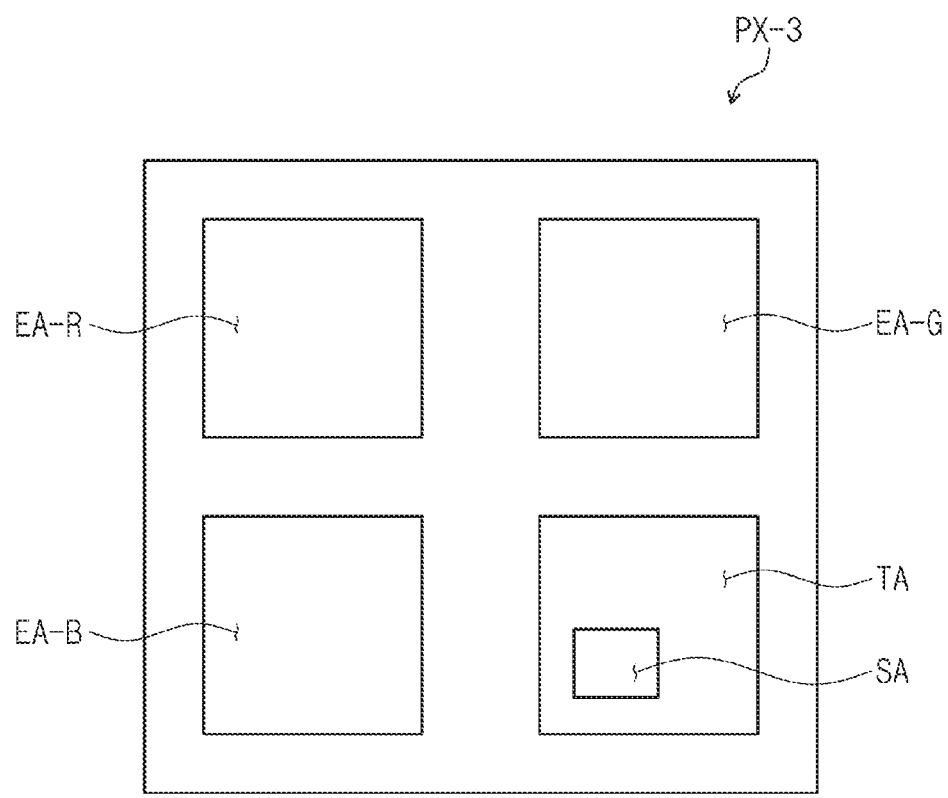

Referring to FIG. 15, the pixel PX-3 may include a plurality of light emitting areas EA-R, EA-G, and EA-B and the transmitting area TA.

The transmitting area TA and the sensing area SA may correspond to the light emitting areas EA-R, EA-G, and EA-B. The light emitting areas EA-R, EA-G, and EA-B may include a red light emitting area EA-R, a green light emitting area EA-G, and a blue light emitting area EA-B. The red light emitting area EA-R, the green light emitting area EA-G, and the blue light emitting area EA-B may be arranged in a two-by-two matrix form, but the arranged order of and/or alignment of the red light emitting area EA-R, the green light emitting area EA-G, and the blue light emitting area EA-B are not particularly limited.

Figure 16A:
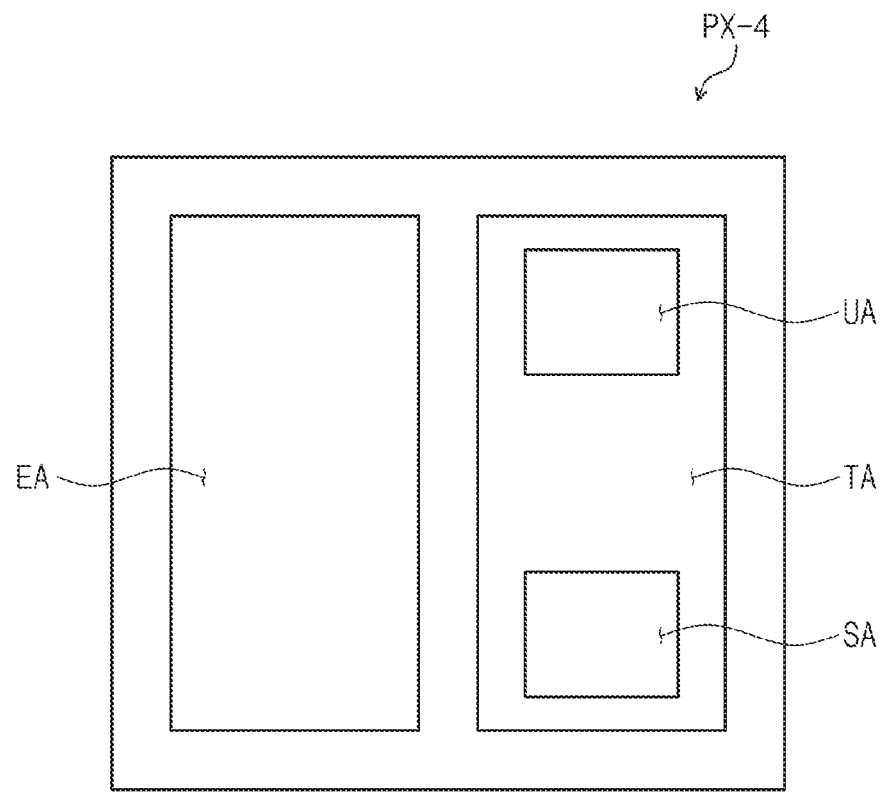
Figure 16B:
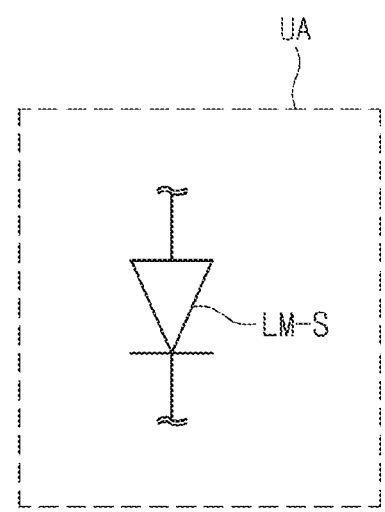
FIG. 16B is an equivalent circuit diagram corresponding to an auxiliary light emitting area shown in FIG. 16A according to some exemplary embodiments.

Referring to FIG. 16A, the pixel PX-4 may include a light emitting area EA and a transmitting area TA. The transmitting area TA may include a sensing area SA and an auxiliary light emitting area UA.

Referring to FIGS. 16A and 16B, the auxiliary light emitting area UA may include an auxiliary light emitting element LM-S. The auxiliary light emitting element LM-S may emit a sensing light to sense the user's touch or recognize the fingerprint of the user. In some exemplary embodiments, the auxiliary light emitting element LM-S may emit the sensing light only when it is difficult to recognize the user's touch or the fingerprint of the user only using the external light. However, according to another exemplary embodiment, a time point at which the auxiliary light emitting element LM-S emits the sensing light may be controlled as necessary. A wavelength (or range of wavelengths) of light emitted via the auxiliary light emitting element LM-S may be the same as or different from the external light.

Figure 17:
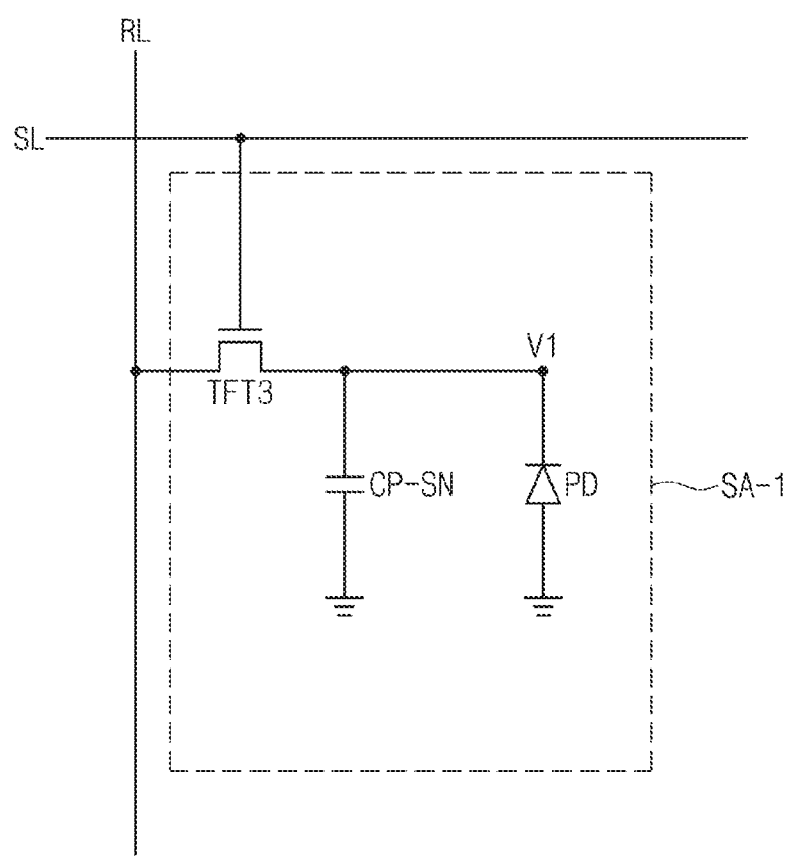
FIG. 17 is an equivalent circuit diagram corresponding to a sensing area according to some exemplary embodiments.

FIG. 17 is an equivalent circuit diagram corresponding to a sensing area SA-1 according to some exemplary embodiments.

FIG. 17 shows the equivalent circuit (hereinafter, referred to as a "sensing circuit") of the sensing area SA-1, which is connected to one scan line SL and one readout line RL, as a representative example. Configurations of the sensing circuit are not limited to those shown in FIG. 17.

The sensing circuit may include a third transistor TFT3, a sensing capacitor CP-SN, and a photodiode PD.

The photodiode PD may perform the role of the fourth transistor TFT4 shown in FIG. 7. The equivalent circuit of the sensing circuit may be different from that of the sensing circuit shown in FIG. 7 by taking into account features in structure and operation of the photodiode PD.

Since no current amplification occurs in the photodiode PD when light is applied to the photodiode PD, the photodiode PD may have a reaction rate faster than that of a phototransistor even though a sensitivity of the photodiode PD with respect to the light is lower than that of the phototransistor.

Figure 18A:
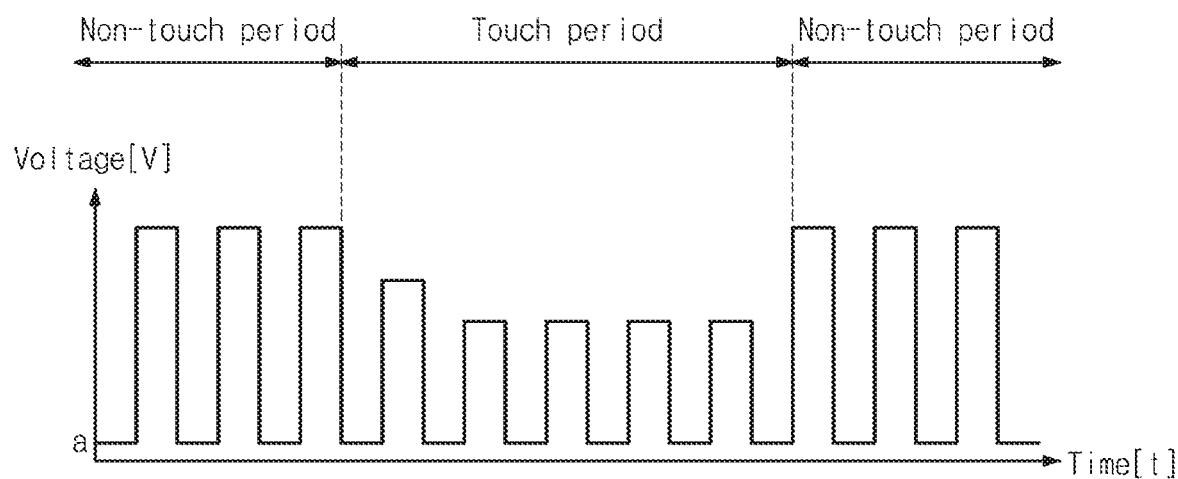
FIGS. 18A and 18B are timing diagrams each showing an intensity of an external light measured by a sensor controller according to various exemplary embodiments.
Figure 18B:
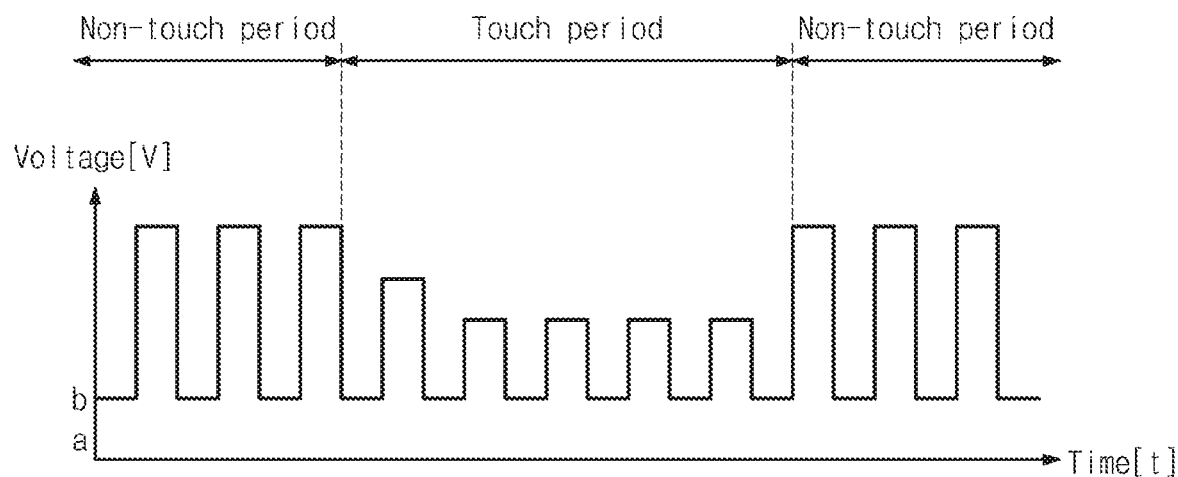
Figure 19:
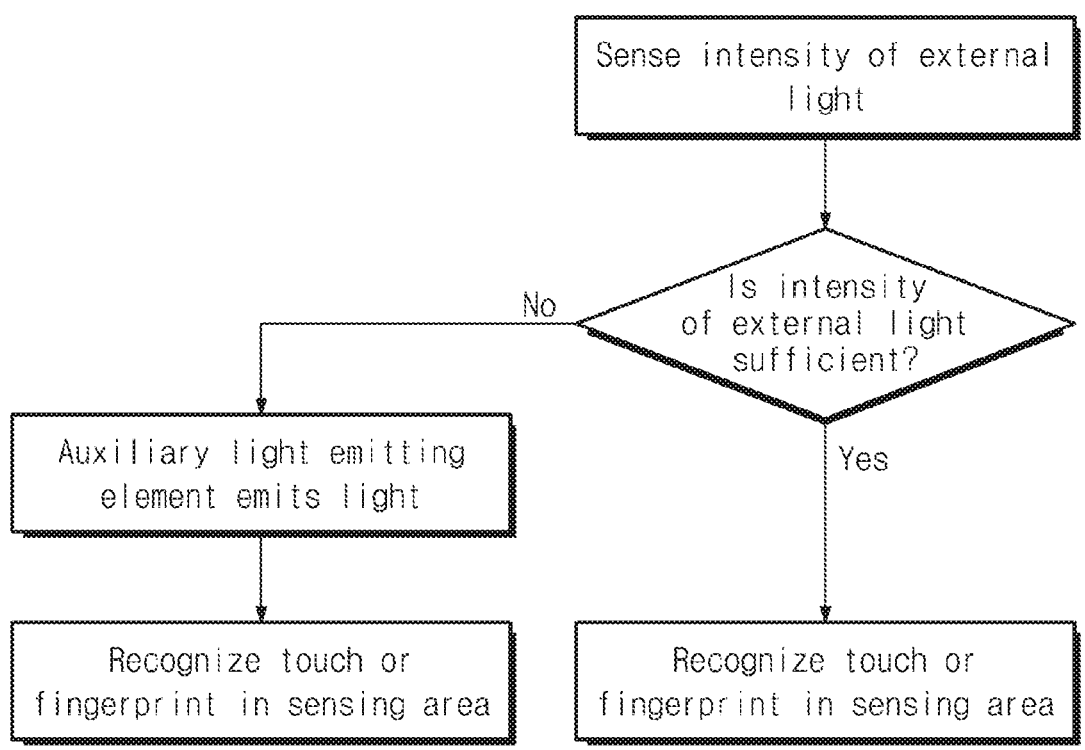
FIG. 19 is a flowchart showing a process of recognizing a user's touch or a user's fingerprint by a display device according to some exemplary embodiments.

FIGS. 18A and 18B are timing diagrams each showing an intensity of external light measured by a sensor controller SC according to various exemplary embodiments. FIG. 19 is a flowchart showing a process of recognizing the user's touch or the fingerprint of the user by the display device DD according to some exemplary embodiments.

FIG. 18A shows an operation of the sensor controller SC that senses whether the user's touch occurs when the intensity of external light is small. The timing diagram shown in FIG. 18A is divided into a touch period and a non-touch period. The touch period is a period in which the user touches the display device DD to control the display device DD, and the non-touch period is a period in which no user's intentional touch occurs.

When the intensity of the external light is small, an offset value of an electrical signal corresponding to the external light is "a" volts. The electrical signal swings at a predetermined amplitude in the non-touch period. However, the electrical signal in the touch period swings at an amplitude different from that of the non-touch period. The sensor controller SC may sense the user's touch or recognize the fingerprint of the user by sensing a variation of the amplitude.

FIG. 18B shows an operation of the sensor controller SC that senses whether the user's touch occurs when the intensity of the external light is large. Referring to FIG. 18B, when the intensity of the external light is large, an offset value of the electrical signal corresponding to the external light is "b" volts. The "b" is greater than the "a." The display device DD may recognize a variation in intensity of the external light by sensing a variation of the offset value.

The display device DD may control the intensity of the light emitted from the light emitting area EA (refer to FIG. 5) depending on the variation in intensity of the external light. In the case that the intensity of the external light is large, the display device DD allows the intensity of the light emitted from the light emitting area EA (refer to FIG. 5) to be increased, and thus, the visibility of the display device DD may be improved.

On the contrary, in the case that the intensity of the external light is small, the display device DD may secure a sufficient visibility even though the intensity of the light emitted from the light emitting area EA (refer to FIG. 5) is small. In a case that the intensity of the external light is small and the intensity of the light emitted from the light emitting area EA (refer to FIG. 5) is large, the visibility may be deteriorated. Accordingly, in the case that the intensity of the external light is small, the display device DD may control the light emitted from the light emitting area EA (refer to FIG. 5) such that the intensity of the light emitted from the light emitting area EA (refer to FIG. 5) is reduced. In this case, the intensity of the light emitted from the light emitting area EA (refer to FIG. 5) may be controlled by the display driver PC (refer to FIG. 8).

Referring to FIG. 19, when the intensity of the external light is sensed and the intensity of the external light is sufficiently large, the user's touch may be sensed or the fingerprint may be recognized in the sensing area SA (refer to FIG. 5) by using only the external light. However, when the intensity of the external light is not sufficiently large, the auxiliary light emitting element LM-S (refer to FIG. 16B) emits the sensing light. The sensing area SA (refer to FIG. 5) senses the sensing light to sense the user's touch or recognize the fingerprint.

Figure 20:
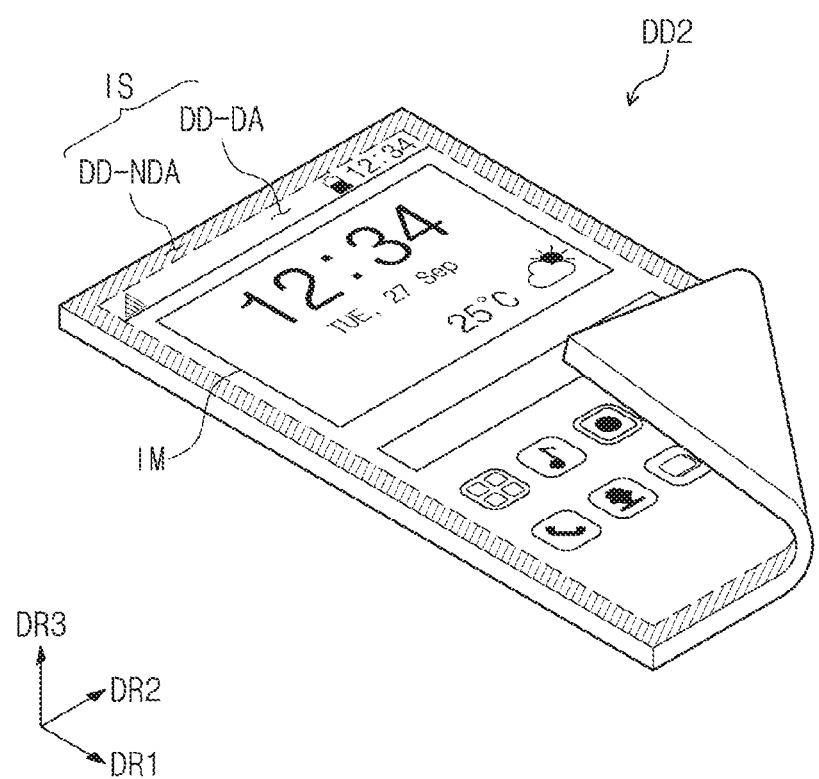
FIG. 20 is a perspective view showing a display device according to some exemplary embodiments.

FIG. 20 is a perspective view showing a display device DD2 according to some exemplary embodiments. Referring to FIG. 20, the display device DD may be partially or entirely bent or rolled.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display panel comprising:
a plurality of pixel areas on a base layer and comprising:
a plurality of light emitting areas, and a plurality of transmitting areas to transmit light incident thereto;
a plurality of photosensors disposed within the plurality of transmitting areas; and
a light emitting element to emit light and disposed within one of the plurality of light emitting areas,
wherein at least one of the plurality of photosensors is configured to receive a portion of light reflected from an external object after transmission of the light through at least one of the plurality of transmitting areas.

2. The display panel of claim 1, wherein a portion of the plurality of transmitting areas is disposed between the plurality of light emitting areas.

3. The display panel of claim 2, wherein the external object comprises a user's body.

4. The display panel of claim 2, wherein at least one of the plurality of photosensors comprises a phototransistor.

5. The display panel of claim 4, wherein the phototransistor has a bottom gate structure.

6. The display panel of claim 5, wherein:
the light is incident to a lower portion of the base layer; and
the external object is disposed above the light emitting element.

7. The display panel of claim 4, wherein the phototransistor has a top gate structure.

8. The display panel of claim 7, wherein:
the light is incident to an upper portion of the light emitting element; and
the external object is disposed under the base layer.

9. The display panel of claim 4, wherein the base layer comprises an opening defined therethrough to transmit the light, at least one of the plurality of transmitting areas overlapping the opening.

10. The display panel of claim 2, wherein at least one of the plurality of photosensors comprises:
a first phototransistor having a top gate structure, and
a second phototransistor having a bottom gate structure.

11. The display panel of claim 2, wherein at least one of the plurality of photosensors comprises a photodiode.

12. The display panel of claim 1, further comprising:
an auxiliary light emitting element to emit a sensing light, the auxiliary light emitting element being disposed within at least one of the transmitting areas,
wherein at least one of the plurality of photosensors is configured to receive a portion of the sensing light reflected from the external object.

13. The display panel of claim 1, wherein an intensity of the light emitted by the light emitting element is varied corresponding to a variation in intensity of the portion of the light.

14. A display device comprising:
a display panel to transmit at least a portion of light incident thereto, the display panel comprising a plurality of pixels,
wherein at least one of the plurality of pixels comprises:
a light emitting area;
a light emitting element to emit light, the light emitting element being disposed in a portion of the light emitting area;
a transmitting area to transmit light incident thereto; and
a photosensor disposed in a portion of the transmitting area,
wherein the light emitting element comprises a reflective electrode disposed within the light emitting area and disposed outside the transmitting area, and
wherein the photosensor is configured to sense a portion of the light reflected from an external object among transmission of light through the transmitting area.

15. The display device of claim 14, wherein the photosensor comprises a phototransistor.

16. The display device of claim 15, further comprising:
a sensor controller electrically connected to the phototransistor to sense a variation in intensity of the portion of the light,
wherein sensation of a touch interaction or epidermal information of the touch interaction is based on the variation in intensity of the portion of the light.

17. The display device of claim 16, wherein the sensor controller is further configured to sense a variation in intensity of the light.

18. The display device of claim 17, further comprising:
a display driver to receive an electrical signal corresponding to the variation in intensity of the light from the sensor controller to control an intensity of the light emitted by the light emitting element.

19. The display device of claim 18, wherein:
the transmitting area further comprises an auxiliary light emitting element to emit a sensing light; and
at least one of the photosensors is configured to receive a portion of the sensing light reflected from the external object.

20. The display device of claim 19, wherein the auxiliary light emitting element is configured to emit the sensing light in response to the intensity of the light being less than or equal to a predetermined value.

* * * * *